(12) United States Patent
Ryan

(10) Patent No.: US 8,441,131 B2
(45) Date of Patent: May 14, 2013

(54) STRAIN-COMPENSATING FILL PATTERNS FOR CONTROLLING SEMICONDUCTOR CHIP PACKAGE INTERACTIONS

(75) Inventor: Vivian W. Ryan, Berne, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/230,457

(22) Filed: Sep. 12, 2011

(65) Prior Publication Data
US 2013/0062775 A1  Mar. 14, 2013

(51) Int. Cl.
  *H01L 23/48* (2006.01)
  *H01L 23/52* (2006.01)
  *H01L 29/40* (2006.01)
  *H01L 21/4763* (2006.01)

(52) U.S. Cl.
  USPC ............ 257/774; 257/737; 257/776; 438/622

(58) Field of Classification Search .......... 257/772–779, 257/678, 690, 621, 622, 700, 758, 780; 438/612–617
  See application file for complete search history.

(56) References Cited

U.S. PATENT DOCUMENTS

| | | | | |
|---|---|---|---|---|
| 5,861,670 A * | 1/1999 | Akasaki | ........................ | 257/737 |
| 6,242,805 B1 * | 6/2001 | Weling | ........................... | 257/752 |
| 6,297,563 B1 * | 10/2001 | Yamaha | ........................ | 257/781 |
| 2002/0137330 A1 * | 9/2002 | Ryan | .............................. | 438/628 |
| 2005/0269702 A1 * | 12/2005 | Otsuka | .......................... | 257/750 |
| 2006/0060967 A1 * | 3/2006 | Lee et al. | ........................ | 257/736 |
| 2008/0246152 A1 * | 10/2008 | Liu et al. | ........................ | 257/758 |
| 2010/0127408 A1 * | 5/2010 | Wang et al. | .................... | 257/779 |
| 2011/0115073 A1 * | 5/2011 | Chen | .............................. | 257/737 |
| 2011/0175211 A1 * | 7/2011 | Cabral et al. | .................. | 257/660 |

OTHER PUBLICATIONS

Joseph E. Shigley, "Mechanical Engineering Design", 7th Edition, ISBN #0-07-252036-1, MCGraw Hill Publication, New York, Chapter 4, pp. 143 (2004).*

* cited by examiner

*Primary Examiner* — Long Tran
*Assistant Examiner* — Dzung Tran
(74) *Attorney, Agent, or Firm* — Williams, Morgan & Amerson, P.C.

(57) ABSTRACT

Generally, the subject matter disclosed herein relates to sophisticated semiconductor chips that may be less susceptible to the occurrence of white bumps during semiconductor chip packaging operations, such as flip-chip or 3D-chip assembly, and the like. One illustrative semiconductor chip disclosed herein includes, among other things, a bond pad and a metallization layer below the bond pad, wherein the metallization layer is made up of a bond pad area below the bond pad and a field area surrounding the bond pad area. Additionally, the semiconductor device also includes a plurality of device features in the metallization layer, wherein the plurality of device features has a first feature density in the bond pad area and a second feature density in the field area that is less than the first feature density.

25 Claims, 7 Drawing Sheets

US 8,441,131 B2

STRAIN-COMPENSATING FILL PATTERNS FOR CONTROLLING SEMICONDUCTOR CHIP PACKAGE INTERACTIONS

BACKGROUND

1. Field of the Disclosure

Generally, the present disclosure relates to sophisticated semiconductor devices, and, more particularly, to strain-compensating fill patterns that are adapted for controlling interactions between semiconductor chips and carrier substrates during the chip/carrier joining process.

2. Description of the Related Art

In the manufacture of modern integrated circuits, it is usually necessary to provide electrical connections between the various semiconductor chips making up a microelectronic device. Depending on the type of chip and the overall device design requirements, these electrical connections may be accomplished in a variety of ways, such as, for example, by wirebonding, tape automated bonding (TAB), flip-chip bonding, and the like. In recent years, the use of flip-chip technology, wherein semiconductor chips are attached to carrier substrates, or to other chips, by means of solder balls formed from so-called solder bumps, has become an important aspect of the semiconductor processing industry. In flip-chip technology, solder balls are formed on a contact layer of at least one of the chips that is to be connected, such as, for example, on a dielectric passivation layer formed above the last metallization layer of a semiconductor chip comprising a plurality of integrated circuits. Similarly, adequately sized and appropriately located bond pads are formed on another chip, such as, for example, a carrier package, each of which corresponds to a respective solder ball formed on the semiconductor chip. The two units, i.e., the semiconductor chip and carrier substrate, are then electrically connected by "flipping" the semiconductor chip and bringing the solder balls into physical contact with the bond pads, and performing a "reflow" process so that each solder ball bonds to a corresponding bond pad. Typically, hundreds of solder bumps may be distributed over the entire chip area, thereby providing, for example, the I/O capability required for modern semiconductor chips that usually include complex circuitry, such as microprocessors, storage circuits, three-dimensional (3D) chips, and the like, and/or a plurality of integrated circuits forming a complete complex circuit system.

In many processing applications, a semiconductor chip is bonded to a carrier substrate during a high temperature so-called Controlled Collapse Chip Connection (C4) solder bump reflow process. Typically, the substrate material is an organic laminate, which has a coefficient of thermal expansion (CTE) that may be on the order of 4-5 times greater than that of the semiconductor chip, which, in many cases, is made up primarily of silicon and silicon-based materials. Accordingly, due to the coefficient of thermal expansion mismatch between the chip and the substrate (i.e., silicon vs. organic laminate), the substrate will grow more than the chip when exposed to the reflow temperature, and as a consequence, stresses will be imposed on the chip/substrate package as the package cools and the solder bumps solidify. FIGS. 1a-1c, which schematically illustrate at least some of the possible effects that may occur on a chip package during this process, will now be described.

FIG. 1a schematically illustrates a chip package 100, which includes a carrier substrate 101 and a semiconductor chip 102. The semiconductor chip 102 typically comprises a plurality of solder bumps 103, which are formed above a metallization system 104 (see FIG. 1c) of the chip 102. During the chip packaging assembly process, the semiconductor chip 102 is inverted, or "flipped," and brought into contact the carrier substrate 101, after which the chip package 100 of FIG. 1a is exposed to a solder bump reflow process 120 at a reflow temperature that exceeds the melting temperature of the solder bump material. Depending on the specific solder alloy used to form the solder bumps 103, the reflow temperature may be upwards of 200°-265° C. During the reflow process 120, when the material of the solder bumps 103 is in a liquid phase, both the carrier substrate 101 and the semiconductor chip 102 are able to thermally "grow" in a substantially unrestrained manner, based on the respective coefficient of thermal expansion of each component. As such, both the carrier substrate 101 and the semiconductor chip 102 remain in an essentially flat, non-deformed condition, although each will grow by a different amount due to their different coefficients of thermal expansion.

FIG. 1b, on the other hand, schematically illustrates the chip package 100 during a cool-down phase, when a thermal interaction begins to take place between the carrier substrate 101 and the semiconductor chip 102. As the chip package 100 cools, the solder bumps 103 solidify and mechanically join the package substrate 101 to the semiconductor chip 102. As the chip package 100 continues to cool after solder bump 103 solidification, the CTE mismatch between the materials of the carrier substrate 101 and the semiconductor chip 102 cause the substrate 101 to shrink at a greater rate than the chip 102. Typically, this difference in thermal expansion/contraction is accommodated by a combination of out-of-plane deformation of both the carrier substrate 101 and the semiconductor chip 102, and some amount of shear deformation of the solder bumps 103. Other localized effects may occur in the semiconductor chip 102 in areas immediately surrounding the solder bumps 103, as illustrated in FIG. 1c and described below.

FIG. 1c schematically illustrates an area of the semiconductor chip 102 surrounding an individual solder bump 103A after cool-down of the chip package 100. For simplicity, the semiconductor chip 102 has been inverted compared to the chip packaging configurations illustrated in FIGS. 1a-1b, and the carrier substrate is not shown. Furthermore, only the uppermost metallization layers 104A, 104B and 104C of a metallization system 104 of the semiconductor chip 102 are shown in FIG. 1c; any metallization layers below layer 104C, device layers, or substrate layers of the chip 102 have not been depicted. The semiconductor chip 102 also includes a bond pad 105 formed in the last metallization layer 104A, a passivation layer 106 formed above the last metallization layer 104A, and a solder bump 103A formed above the bond pad 105. Additionally, as shown in FIG. 1c, the bond pad 105 is in contact with a contact structure 107 so as to facilitate the electrical connection of the solder bump 103A and the carrier substrate 101 (not shown in FIG. 1c) to an integrated circuit (not shown) of the semiconductor chip 102 formed in the device level (not shown) below the metallization system 104. For illustrative purposes only, the contact structure 107 may include, for example, a contact via 107B formed in the metallization layer 104B, a conductive line 107C and a contact via 107D in the metallization layer 104C, and the like, whereas other configurations may also be used.

During the cool-down phase, the out-of-plane deformation of the chip package 100 that is caused by the thermal interaction of the semiconductor chip 102 and the carrier substrate 101 will develop as a shear load 103S, a tensile load 103T, and bending moment 103M across the solder bump 103A. However, since the solder material is, in general, very robust, and typically has a strength that exceeds that of the materials that make up the semiconductor chip 102—and in particular, the metallization system 104—relatively little deformation energy will be absorbed by the solder bump 103A. Instead, the majority of the loads 103S, 103T and 103M will be translated through the bond pad 105 and into the metallization layers underlying the solder bump 103A, resulting in highly localized tensile stresses, such as a vertical or uplift tensile stress 104U, and a lateral or stretching tensile stress 104S. If these tensile stresses are high enough, a local delamination of one or more of the uppermost metallization layers may occur below the solder bump 103A. Typically, a metallization layer delamination will manifest as a crack 108, and will normally occur where the uplift tension is highest—i.e., near the edge 105E of the bond pad 105, as shown in FIG. 1c. In many cases, the crack 108 may only occur in a single metallization layer, such as the layer 104B shown in FIG. 1c, whereas in other cases, and depending on several factors, the crack 108 may propagate either deeper or shallower into the underlying metallization system 104, from one metallization layer to another.

Delamination failures and cracks, such as the crack 108, that may occur in a metallization layer below a solder bump 103 are sometimes subject to premature failure, as the solder bump 103 may not make a good electrical connection to the contact structures below. However, since the delamination/crack defects described above do not occur until the chip packaging assembly stage of semiconductor chip manufacture, the defects will generally not be detected until a final quality inspection is performed. Typically, after the flip-chip operation is completed, the chip package 100 will be subjected to acoustic testing, such as C-mode acoustic microscopy (CSAM). Cracks 108 that may be present in the metallization system 104 of the semiconductor chip 102 below the solder bumps 103 will have a white appearance during the CSAM inspection process, and are therefore sometimes referred to as "white bumps," "white spots," or "ghost bumps." White bump defects impose a costly downside to the overall chip manufacturing process, as they do not occur, and hence cannot be detected, until a significant material and manufacturing investment in the chip has already occurred.

Moreover, recent changes and advances in the types of materials used in sophisticated semiconductor devices have also had an impact on the frequency in which white bumps occur. For example, for many years, the materials used for forming solder balls used in flip-chip technology included any one of a variety of so-called tin/lead (Sn/Pb) solders. Typically, the alloys that were used for most Sn/Pb solders have a level of ductility that enabled the Sn/Pb solder bumps to deform under the loads induced during the cool-down phase of the solder bump reflow process, thereby absorbing some of the out-of-plane deformation energy discussed above. However, in recent years, industries have generally moved away from the use of Sn/Pb solders in most commercial applications, including semiconductor processing. Accordingly, lead-free soldering materials, such as Sn/Ag (tin-silver), Sn/Cu (tin-copper), Sn/Ag/Cu (tin-silver-copper, or SAC) solders, and the like, have been developed as substitute alloys for forming solder bumps on semiconductor chips. These lead-free substitute soldering materials generally have a higher material strength and lower ductility than most of the commonly-used Sn/Pb solders, and also typically require higher temperatures for reflow. As such, less deformation energy is absorbed by lead-free solder bumps, and a commensurately higher loading is imparted on the metallization system underlying the solder bumps, which subsequently increases the frequency of white bump occurrence.

Additionally, the development and use of dielectric materials having a dielectric constant (or k-value) of approximately 3.0 or lower—which are often referred to as "low-k dielectric materials" or "extreme low-k dielectric materials"—has led to an increased incidence of white bumps. Typically, low-k dielectric materials have lower mechanical strength, mechanical modulus, and adhesion strength than do some of the more commonly used dielectric materials having higher k-values, such as silicon dioxide, silicon nitride, silicon oxynitride, and the like. As metallization systems utilize more metallization layers that are made up of low-k dielectric materials, there is a greater likelihood that the lower strength low-k materials will rupture when exposed to the loads that are imposed on the metallization layers underlying the solder bumps, thus leading to delaminations and cracks—i.e., white bump defects. In particular, cracks tend to occur, or at least initiate, in the low-k metallization layers that are closest to the upper surface of the a semiconductor chip—i.e., closest to the last metallization layer—as the deformation energy is greatest near the upper surface, and lessens in lower metallization levels. Furthermore, it appears that the type of white bump problems described above are even further exacerbated in metallization layers comprised of ultra-low-k (ULK) materials having k-values of approximately 2.7 or lower.

It should be noted that, while FIGS. 1a-1c describe typical white bump problems that may be associated with flip-chip packaging problems, the issues identified above are equally applicable to other chip package configurations, such as 3D-chips and the like. Accordingly, and in view of the foregoing, there is a need to implement new design strategies to address the manufacturing issues associated with white bumps that occur during typical chip packaging operations. The present disclosure relates to process device designs and methods that are directed to avoiding, or at least mitigating, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to sophisticated semiconductor chips that may be less susceptible to the occurrence of white bumps during semiconductor chip packaging operations, such as flip-chip or 3D-chip assembly, and the like. One illustrative semiconductor chip disclosed herein includes, among other things, a bond pad and a metallization layer below the bond pad, wherein the metallization layer is made up of a bond pad area below the bond pad and a field area surrounding the bond pad area. Additionally, the semiconductor device also includes a plurality of device features in the metallization layer, wherein the plurality of device features has a first feature density in the bond pad area and a second feature density in the field area that is less than the first feature density.

In another illustrative embodiment of the present subject matter, a semiconductor chip includes a bond pad in a last metallization layer of the semiconductor chip and a flexible structure comprising an upper end and a lower end, wherein the upper end is in a metallization layer below the bond pad, the lower end is in a metallization layer below the upper end, and the upper end is closer to a centerline of the semiconductor chip than the lower end.

A further illustrative embodiment disclosed herein is a semiconductor device that includes, among other things, a bond pad in a last metallization layer of the semiconductor chip and a first flexible structure comprising a first upper end and a first lower end, wherein the first upper end is below the bond pad, the first lower end is in a metallization layer below the first upper end, and the first upper end is closer to a centerline of the semiconductor chip than the first lower end. The disclosed semiconductor device also includes a second flexible structure comprising a second upper end and a second lower end, wherein the second upper end is below the bond pad, the second lower end is in a metallization layer below the second upper end, the second upper end is closer to the centerline than the second lower end, and the first upper is closer to the centerline than the second upper end.

BRIEF DESCRIPTION OF THE DRAWINGS

The disclosure may be understood by reference to the following description taken in conjunction with the accompanying drawings, in which like reference numerals identify like elements, and in which:

FIG. 3b schematically illustrates some aspects of one arrangement of a flexible structure as shown in FIG. 3a.

Figure 1A:
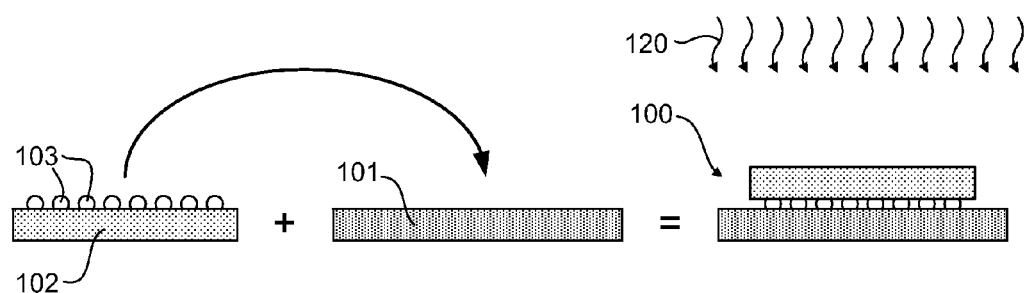
FIGS. 1a-1b schematically illustrate a flip-chip packaging operation of a semiconductor chip and a carrier substrate.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the presently disclosed subject matter is directed to semiconductor chips wherein strain-compensating fill patterns may be formed in the metallization layers of the chip metallization system that are adapted to reduce, or at least mitigate, the occurrence of white bumps caused by the differential thermal expansion effects imposed on the metallization layers of the semiconductor chip during chip packaging operations. As a person of ordinary skill may appreciate, a metallization layer may be made up of numerous contact vias and conductive lines formed in a dielectric material layer. Furthermore, in many instances the vias and lines making up the metallization layer may be of different sizes and/or lengths, and the relative positioning of these elements in a given metallization layer will generally be a based on the required circuit layout of chip. When a chemical mechanical polishing (CMP) process is performed on such a metallization layer, the different characteristics of the various materials making up the metallization layer, such as polishing rates and the like, may result in a surface that may not be uniformly planarized. This phenomenon is sometimes referred to as a "dishing" effect, wherein the surface of the metallization layer may have localized dips and valleys. Accordingly, using the novel techniques disclosed herein, a fill pattern, which may comprise, for example, a plurality of metal plugs and the like, may be distributed throughout the metallization layer so as to create a "balancing" effect during the CMP process, thereby reducing the severity of the "dishing" effect described above. However, it should be appreciated that the strain-compensating fill patterns of the present disclosure may be included in a given metallization layer even in those embodiments where the above-described CMP "dishing" effect may not be present, or where the degree of CMP "dishing" would not normally require the use of fill patterns to "balance" the planarization process.

The present subject matter is therefore directed to the use of strain-compensating fill patterns in one or more metallization layers of a chip metallization system that may serve to locally strengthen the metallization layers while still providing the CMP "balancing" effect described above. Accordingly, the fill pattern may have areas wherein the pattern has a substantially uniform distribution density, such as described above, whereas in other areas, the fill pattern may be modified—i.e., to a strain-compensating fill pattern—such that the distribution density varies in areas of particular concern, thereby at least partially compensating for the higher out-of-plane loadings that may occur in those areas. Furthermore, in at least some embodiments, the strain-compensating fill patterns in the metallization layers near the top—e.g., near and/or below the last metallization layer—of the chip metallization system, where the strains induced by the differential thermal expansion of the chip and the substrate carrier during the reflow process may be greatest.

For example, in some illustrative embodiments, the strain-compensating fill patterns of the present disclosure may be formed below and in the vicinity of bond pads that are located in areas of a semiconductor chip that are typically exposed to the highest out-of-plane loads caused by the CTE (coefficient of thermal expansion) mismatch between the semiconductor chip and the carrier substrate. Accordingly, such strain-compensating fill patterns may aid in reducing the magnitude of the crack-inducing stresses and/or strains induced in the metallization layers underlying a given solder bump and bond pad. For example, since the size of a body—i.e., its length or width—is one factor that may have a significant effect on the total amount of thermal expansion that body undergoes when exposed to an elevated temperature, the points of greatest thermal interaction may occur in those areas of the semiconductor chip which are farthest from a neutral center, or centerline, of the chip. Accordingly, in some illustrative embodiments, at least some of the strain-compensating fill patterns may be located below and/or near bond pads that may be located in one or more of the corner regions of the semiconductor chip, where the differential thermal expansion problems discussed above may be the greatest. Moreover, these strain-compensating effects may be of particular importance when the affected metallization layers below the bond pads are made up of low-k and/or ultra-low-k (ULK) dielectric materials, both of which generally have substantially reduced mechanical strength as compared to typical oxide or nitride dielectrics.

Figure 1B:
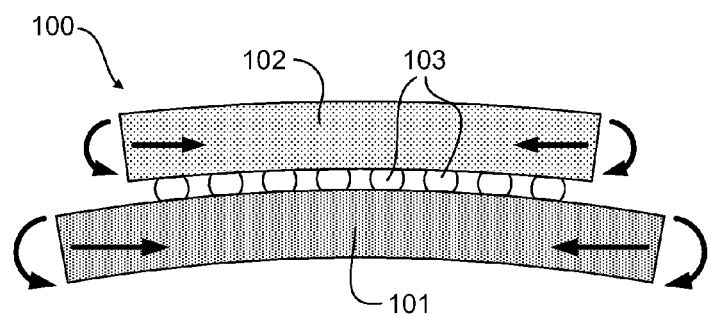
Figure 1C:
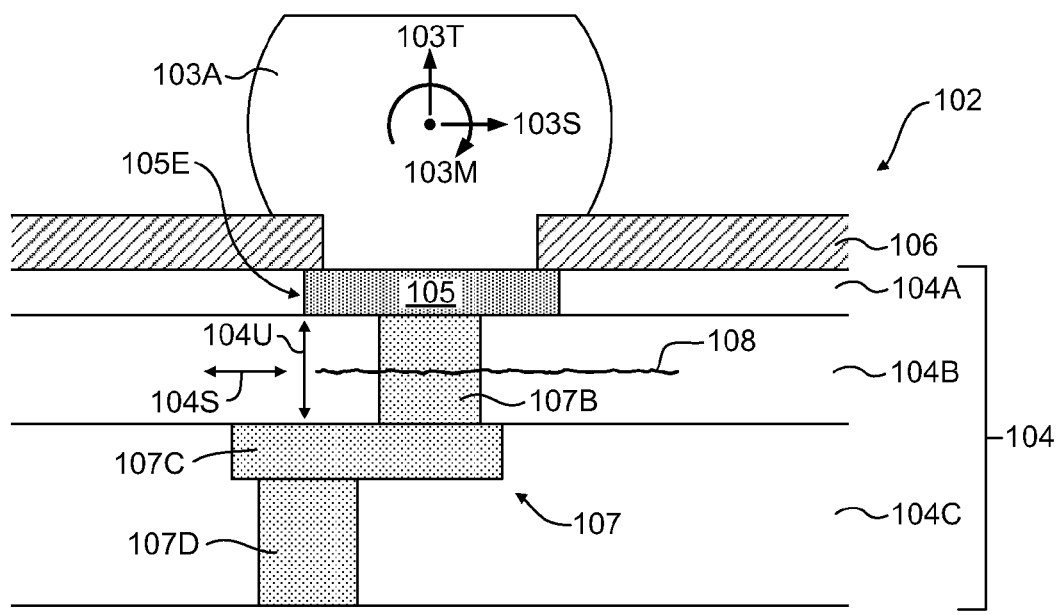
FIG. 1c schematically illustrates out-of-plane loading on a solder ball and metallization system of a semiconductor chip after the flip-chip packaging operation of FIGS. 1a-1b.

It should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor chip 102 depicted in FIG. 1c, it should be understood that the passivation layer 106 is formed "above" the last metallization layer 104A, and the conductive bond pad 105 is positioned "below" or "under" the solder bump 103A. Similarly, it should also be noted that the passivation layer 106 may be positioned "on" the last metallization layer 104A in those embodiments wherein no other layers or structures are interposed therebetween.

Figure 2A:
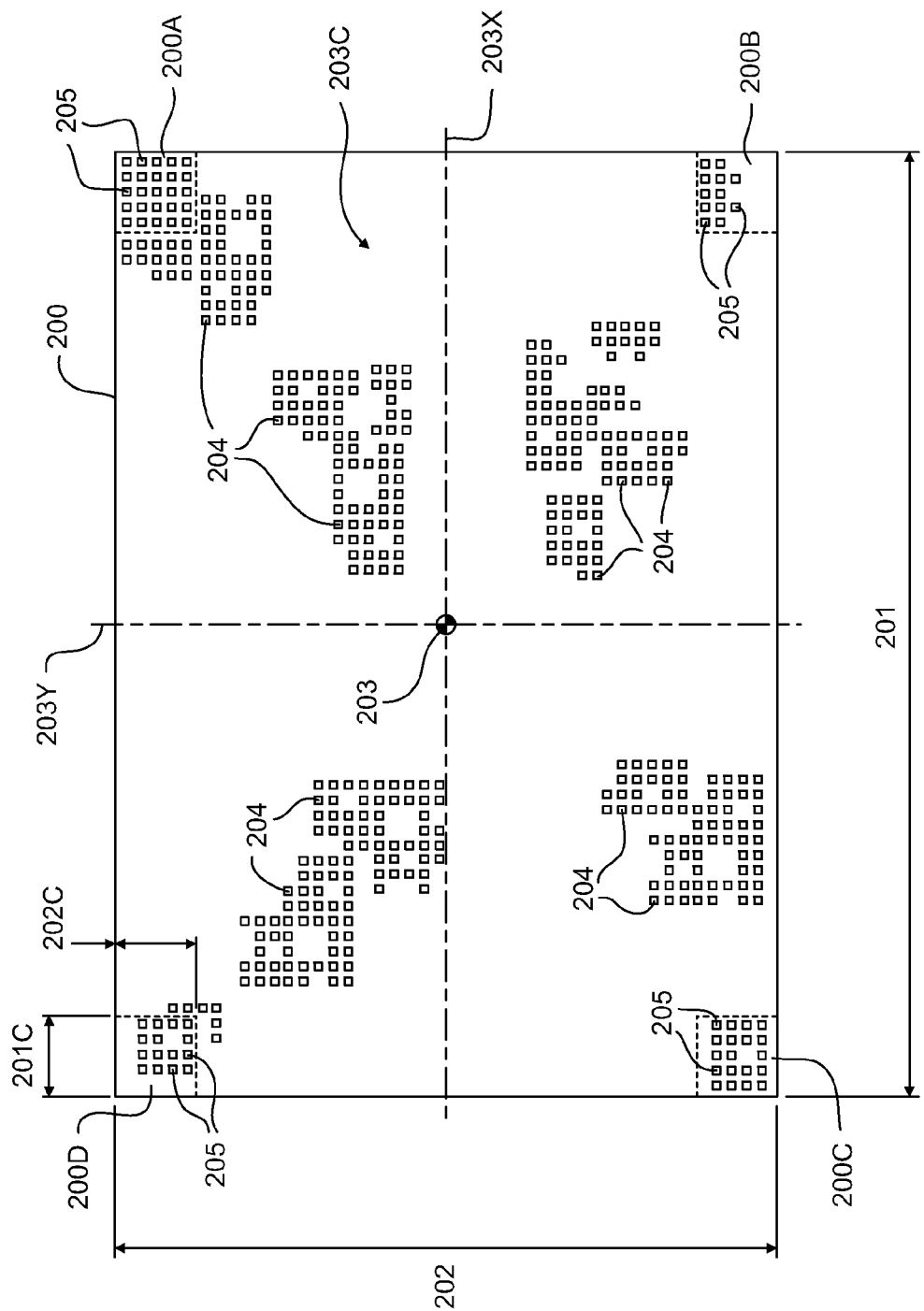
FIG. 2a schematically illustrates a plan view of a semiconductor chip in accordance with one illustrative embodiment of the present disclosure.

FIG. 2a schematically depicts a plan view of an illustrative embodiment of a semiconductor chip 200 in accordance with one illustrative embodiment of the present disclosure. The semiconductor chip 200 may have a substantially rectangular configuration, having a chip length 201 and a chip width 202, as well as a chip center 203 through which runs a first centerline 203X aligned with the chip length 201 and a second centerline 203Y aligned with the chip width 202. Depending on the specific application, the chip length and width dimension 201, 202 of the semiconductor chip 200 may range from approximately 0.5 cm up to approximately 2.5 cm or even larger. It should be noted that the chip length 201 and chip width 202 need not have the same dimensions, although they may in some embodiments. In certain illustrative embodiments, the semiconductor chip 200 may include a plurality of bond pads 204 that are generally located in a substantially central region 203C of the semiconductor chip 200. Additionally, the semiconductor chip 200 may also include a plurality of bond pads 205 that located away from the central region 203C in each of the corner regions 200A-D of the semiconductor chip 200, where chip package thermal interactions are typically highest, and where white bump occurrence may be higher, as previously discussed. Additionally, it should be understood that a plurality of solder bumps, such as the solder bumps 103 of FIGS. 1a-1c, may be formed above both pluralities of bond pads 204 and 205, and which for clarity are not shown. Furthermore, it should also be understood that the semiconductor chip 200 may be assembled in a chip package using a flip-chip operation, much as described above with respect to the semiconductor chip 102 of the chip package 100 and illustrated in FIGS. 1a-1b, although other assembly techniques may also be employed.

In certain illustrative embodiments, each of the corner regions 200A-D may have a length 201C that is approximately one-tenth, or 10%, of the chip length 201, and a width 202C that is approximately one-tenth, or 10%, of the chip width 202. Moreover, it should be noted that in at least some illustrative embodiments of the present disclosure, both pluralities of bond pads 204 and 205 may be arranged on a substantially square or rectangular grid-like pattern so as to facilitate the photolithography patterning process that may be used to pattern the final metallization layer of the semiconductor chip, as well as the passivation layer and the solder bumps formed thereabove. Moreover, depending on the device design and layout requirements, the spacing and/or density of the grid-like pattern may vary from area to area over the semiconductor chip 200, or the grid-like pattern may continue substantially uninterrupted over the entirety of the semiconductor chip 200.

Figure 2B:
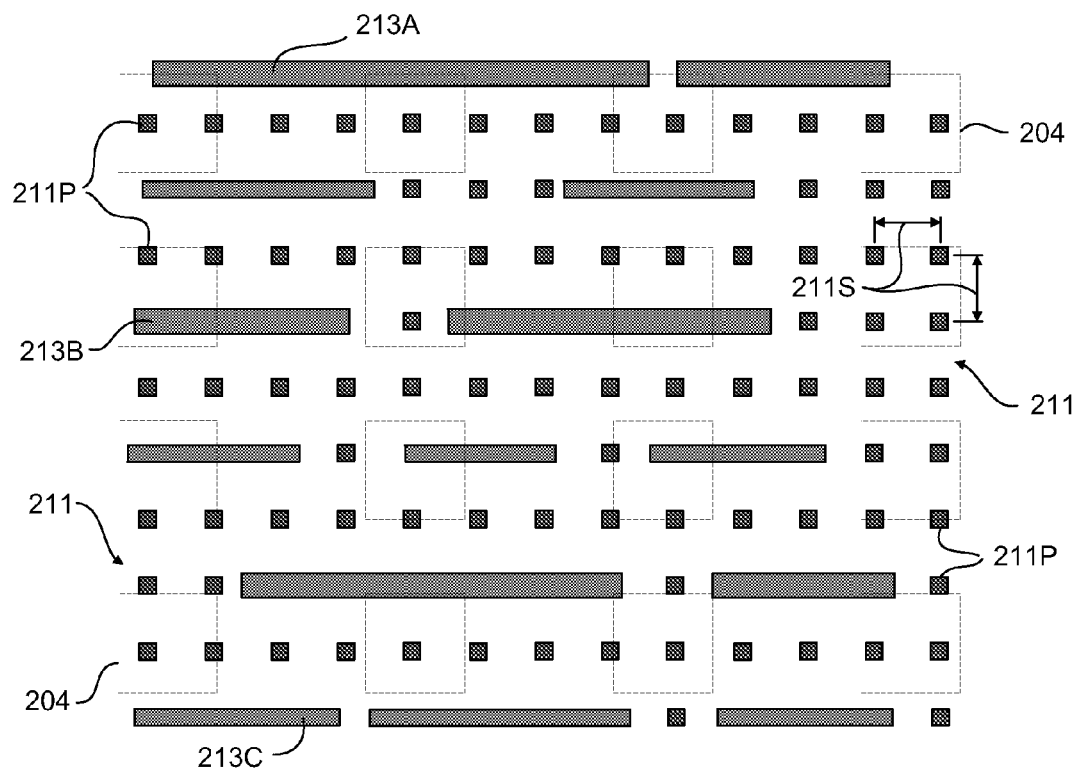
FIGS. 2b-2c schematically illustrate a substantially uniform fill pattern of a representative prior art semiconductor device.

FIG. 2b schematically illustrates a plan view of a substantially uniform fill pattern 211 as might typically be used in a metallization layer 212C of the semiconductor chip 200 in areas of the chip 200 where the effects of the CTE mismatch between the chip 200 and a carrier substrate (not shown) may not be so detrimental as to cause white bump occurrences. For example, the substantially uniform fill pattern 211 may be located in general field area of the semiconductor chip 200, such as the substantially central region 203C of the chip 200 as shown in FIG. 2a, and below one or more of the bond pads 204 (shown in FIG. 2b as dotted lines). In some illustrative embodiments, the substantially uniform fill pattern 211 may include, for example, a plurality of plugs 211P, which may be distributed throughout the metallization layer 212C based on a substantially uniform spacing density 211S. Additionally, the plugs 211P may be interspersed around one or metal lines 213A, 213B, 213C, etc., each of which may form a part of the overall circuit layout (not shown) of the semiconductor chip 200 in the metallization layer 212C. The plugs 211P may be of any shape or configuration, e.g., round, square, octagonal, and/or hexagonal, and the like, when viewed from above.

Depending on the required "balancing" effect of the substantially uniform fill pattern 211 during a planarization process—which may depend on several factors, such as the number of metal lines 213A-C, etc., the materials comprising the metal lines 213A-C, etc., and the dielectric fill material of the metallization layer 212C—the plugs 211P may be made up of metal materials similar to that of the metal lines 213A-C, etc. For example, the plugs 211P may comprise one of several conductive metals well known in the art, such as aluminum, copper, tungsten, and the like, as well as alloys thereof. Different non-metallic fill materials, such as graphene and the like, may also be used, again depending on the requisite "balancing" effect during CMP. In some embodiments, the plugs 211P may be sized such that a critical dimension of the plugs 211P may be substantially the same as the critical dimension of, for example, contact vias (not shown) formed in the same metallization layer 212C that make up part of the overall semiconductor circuit layout. Furthermore, depending on the overall device design requirements, some of the plugs 211P may actually be contact vias, and thus may be electrically connected to circuit layout of the semiconductor chip 200. In other cases, the plugs 211P may simply be "dummy" structures, i.e., structures that do not play a role in electrical transmission.

Figure 2C:
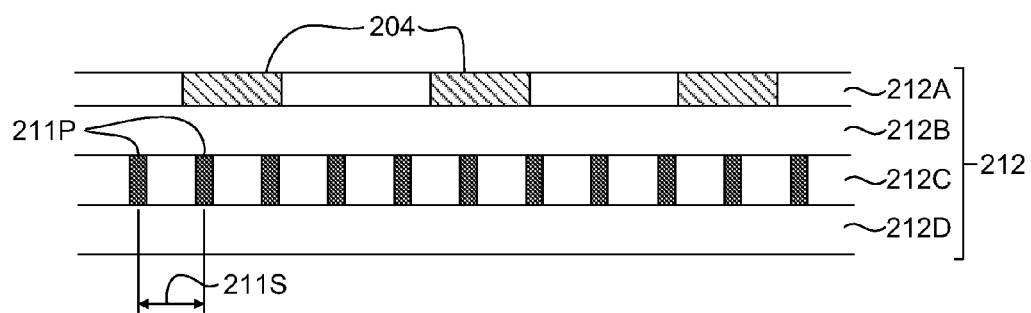

FIG. 2c schematically illustrates a section view of the substantially uniform fill pattern 211 depicted in FIG. 2b and described above. In the illustrative embodiment shown in FIG. 2c, the plurality of plugs 211P are positioned in the metallization layer 212C (see FIG. 2c), which may be one of several metallization layers 212A-D, etc., making up a metallization system 212. Furthermore, the plugs 211P may be distributed throughout the metallization layer 212C based on a substantially uniform spacing density 211S, and positioned within the layer 212C without regard to the specific locations of the bond pads 204 formed in the last metallization layer 212A above the plugs 211P.

Figure 2D:
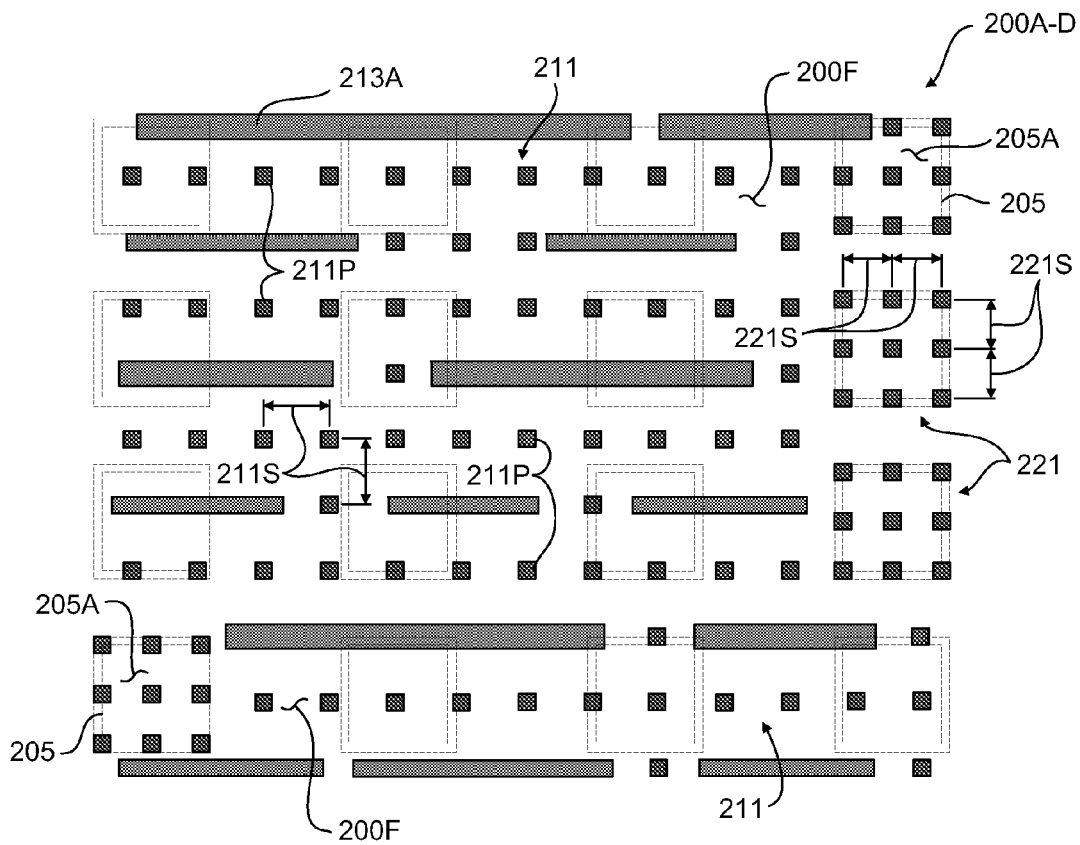
FIG. 2d-2e schematically illustrate a strain-compensating fill pattern in accordance with one illustrative embodiment of the present disclosure.

FIG. 2d schematically illustrates a plan view of one illustrative embodiment of a strain-compensating fill pattern 221 of the present disclosure. The strain-compensating fill pattern 221 may be used in the metallization layer 212C (see FIG. 2c) in areas of the semiconductor chip 200 where the overall detrimental effects of the CTE mismatch between the chip 200 and a carrier substrate (not shown) may have a greater likelihood of creating white bump occurrences, such as, for example, in the area of the bond pads 205 in the corner regions 200A-D of the semiconductor chip 200 (see FIG. 2a). Similar to the substantially uniform fill pattern 211, the strain-compensating fill pattern 221 may also include a plurality of plugs 221P, which in certain embodiments may be of a substantially same size as the plugs 211P. Furthermore, depending on the overall CMP "balancing" requirements, the plugs 221P may be also made up of one or more conductive metals well known in the art, such as aluminum, copper, tungsten and the like.

In some illustrative embodiments, the plugs 221P of the strain-compensating fill pattern 221 located in the area of the corner region bond pads 205 (shown in FIG. 2d as dotted lines) may have a higher spacing density 221S when compared to the spacing density 211S of the plugs 211P in the area of the substantially centrally located bond pads 204. Furthermore, in certain embodiments, such as those illustrated in FIG. 2d, use of the strain-compensating fill pattern 221 may be specifically limited to bond pad areas 205A that are immediately surrounding and below the bond pads 205, whereas an otherwise substantially uniform fill pattern, such as the fill pattern 211 illustrated in FIGS. 2b-2c, may still be utilized in the field area 200F of the corner regions 200A-D between and surrounding each of the bond pad areas 205A. In this way, the higher spacing density 221S of the plugs 221P may act to strengthen and reinforce areas immediately below the bond pads 205 by locally increasing the effective elastic modulus of the semiconductor chip 200 in those areas where the likelihood of white bump occurrences may be highest. Moreover, the spacing density 221S, while higher than the spacing density 211S, may also be substantially uniform in some embodiments, while in other embodiments, the spacing density 221S may be substantially non-uniform, as may be required by the layout of other elements—e.g., vias and lines—in a given metallization layer. Additionally, only relatively minor adjustments may be required to the lithography and patterning steps used for forming the overall fill pattern of the semiconductor chip 200 in the corner regions 200A-D, thus limiting the impact that the use of the strain-compensating fill pattern 221 may have on the overall processing flow of the chip 200.

Figure 2E:
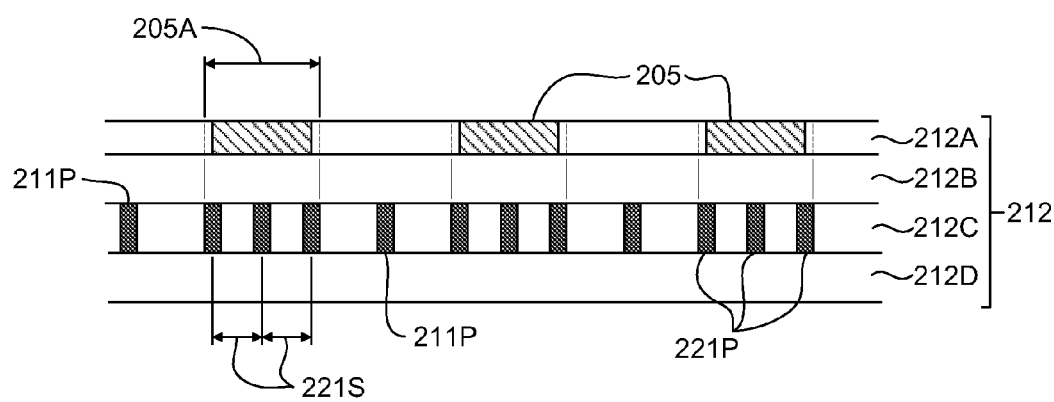

FIG. 2e schematically illustrates a section view of the substantially uniform fill pattern 211 and strain-compensating fill pattern 221 of FIG. 2d. As shown in FIG. 2c, the pluralities of plugs 211P and 221P are both positioned in the metallization layer 212C of the metallization system 212, and the plugs 221P are generally positioned in the bond pad areas 205A below surrounding and below the bond pads 205 based on the spacing density 221S. The plugs 211P, on the other hand, may be generally distributed throughout the metallization layer 212C based on the substantially uniform spacing density 211S, and without regard to the specific locations of the bond pads 205 formed in the last metallization layer 212A thereabove.

The substantially uniform fill pattern 211 and strain-compensating fill pattern 221 of FIGS. 2b-2e may be formed using the same photolithography, patterning, and material deposition techniques used to form the overall circuit layout of the semiconductor chip 200—techniques that are well known to those having ordinary skill in the art. For example, in those embodiments of the present disclosure wherein the plugs 211P and/or plugs 221P may comprise, for example, copper or copper alloy conductive materials, the fill patterns 211, 221 may be formed using a damascene technique, wherein openings may be formed in the respective metallization layer, a seed layer may be deposited inside of the openings, and the openings filled using a suitable material deposition technique, such as electrochemical plating and the like. Other schemes which do not otherwise interrupt the normal processing flow of the back end of line (BEOL) metallization structures may also be utilized.

Figure 3A:
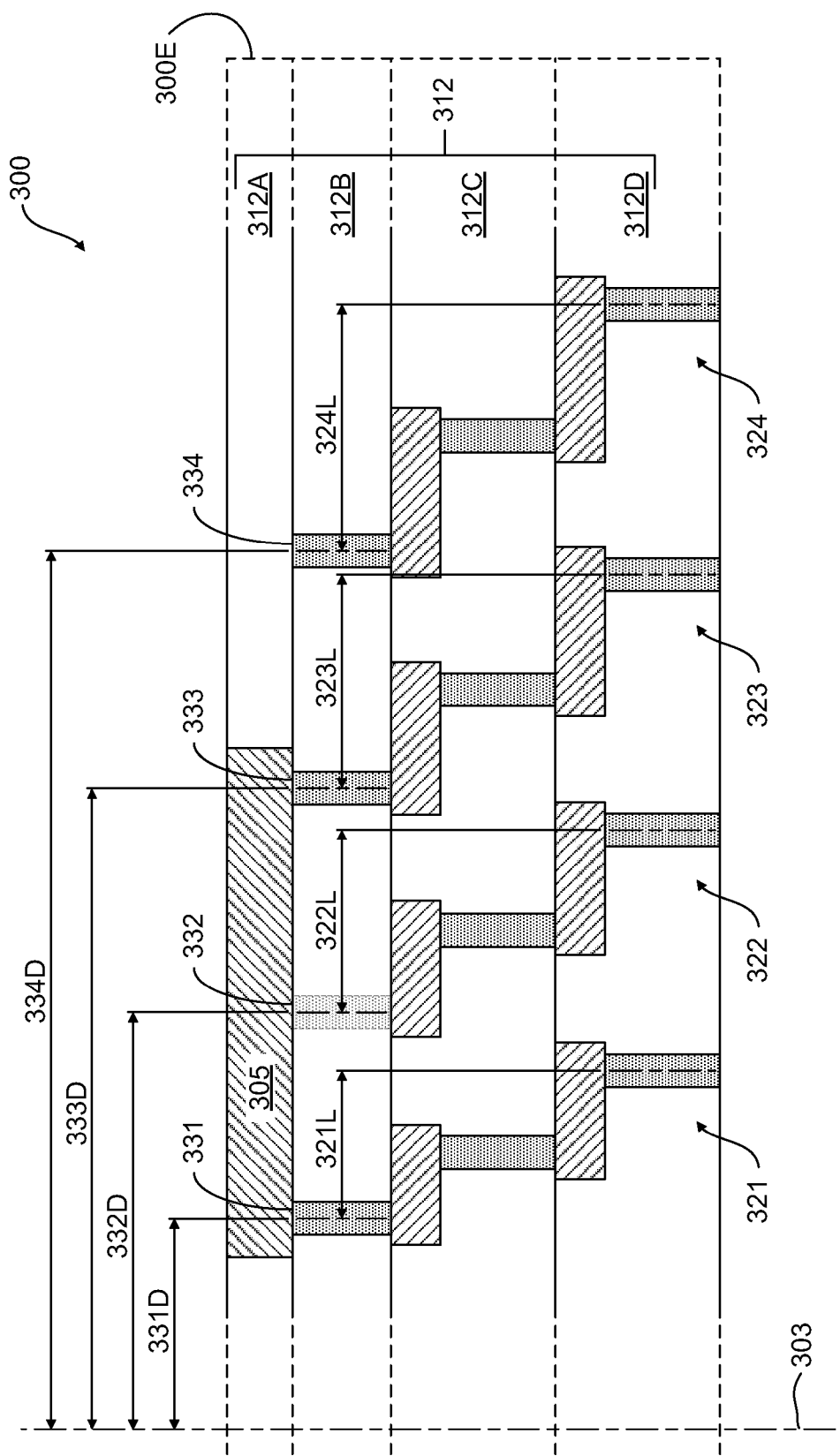
FIG. 3a schematically illustrates a section view of another illustrative embodiment of a strain-compensating fill pattern disclosed herein.
Figure 3B:
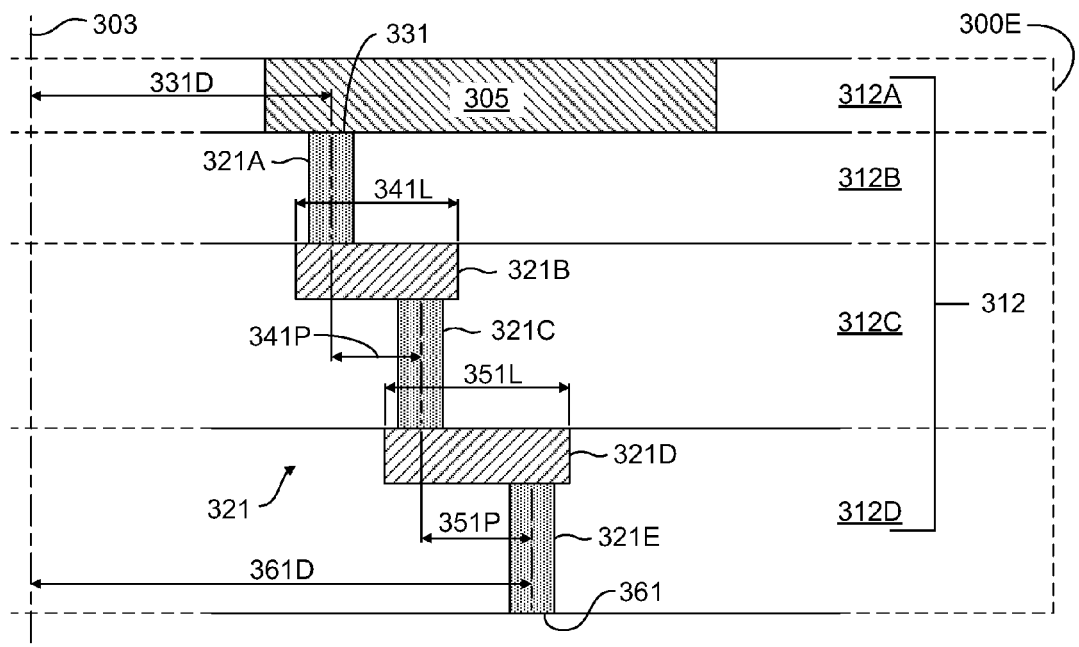
Figure 3C:
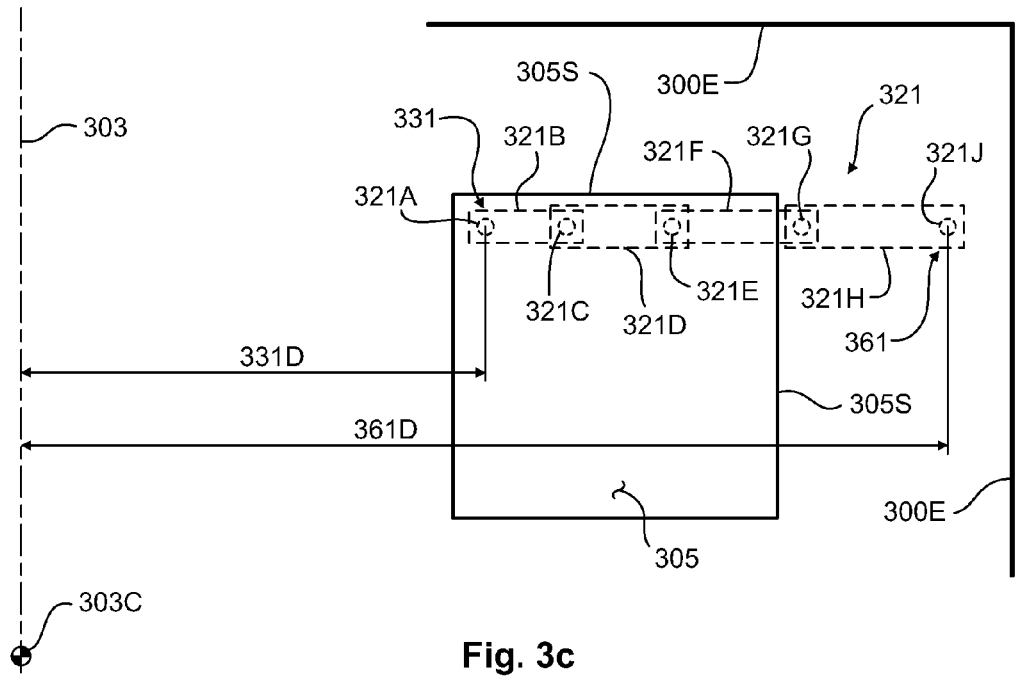
FIG. 3c schematically depicts a plan view of the illustrative flexible structure shown in FIG. 3b.

FIGS. 3a-3c, which schematically illustrate yet another embodiment of a strain-compensating fill pattern in accordance with the present disclosure, will now be described in detail below.

FIG. 3a schematically depicts a section view of a semiconductor chip 300 that includes, among other things, a bond pad 305 that may be formed in a last metallization layer 312A of a metallization system 312, as well as a plurality of additional metallization layers, such as the metallization layer 312B-D, below the last metallization layer 312A. The four metallization layers 312A-D shown in FIG. 3 are for illustrative purposes only, and it should be understood that the metallization system 312 may include five, ten, or even more metallization layers altogether. The semiconductor chip 300 may also include one or more flexible structures located in the metallization system 312 below the bond pad 305, such as the structures 321, 322, 323 and 324 shown in FIG. 3a. Additionally, one or more of the flexible structures 321-324 may be made up of a series of interconnected contact vias and conductive lines, such that the flexible structures 321-324 may act as a sort of mechanical "spring," thereby absorbing at least some of the deformation energy transmitted to the metallization system 312 by the thermal interaction between the semiconductor chip 300 and a carrier substrate (not shown) during the chip reflow process. In this way, less energy may be transmitted to the underlying low-k and ULK dielectric material layers of the metallization system 312. Furthermore, the use of a plurality of flexible structures below the bond pad 305, such as the flexible structures 321-324, may also serve to brace the uppermost metallization layers against lateral strains that might be induced in the metallization system 312 under the same thermal loading conditions. Moreover, similar to the plugs 211P and 221P described above, one or more of the flexible structures 321-324 may be electrically active structures, or they may be "dummy" structures that do not play an active role in the semiconductor circuit, as will be further described below.

As noted above, one or more of the flexible structures 321-324 may be made up of a series of interconnected contact vias and conductive lines, thus providing mechanical spring-like flexibility. In some embodiments, the contact vias and conductive lines of the flexible structures 321-324 may be formed during the same process flow used for forming the vias and lines in each metallization layer that make up the circuit layout (not shown) of the semiconductor chip 300. Accordingly, the flexible structures 321-324 may comprise any one of several commonly used conductive metals, such as copper, tungsten, and/or aluminum, and the like, as well as alloys thereof. Additionally, any one or all of the flexible structures 321-324 may also be arranged so that it is an integral part of the semiconductor chip 300 circuit layout, and therefore may be electrically connected to the bond pad 305 at, for example, the uppermost contact via of the respective flexible structure, such as the flexible structures 321 and 323 of FIG. 3a. It should be understood, however, that in some illustrative embodiments, any or all of the flexible structures, such as the flexible structure 322, may not include an uppermost contact via (indicated as a dotted element in FIG. 3a), and as may have a conductive line as the uppermost element. Other configurations may also be used.

As shown in FIG. 3a, each flexible structure 321-324 may have a respective lateral length 321L-324L, as measured away from a centerline 303 of the semiconductor chip 300 and towards an edge 300E of the chip 300. Additionally, in certain embodiments, the lateral lengths 321L-324L may grow successively larger as the respective distances of the flexible structures 321-324 from the chip centerline 303 increases. For example, the uppermost end 331 of the flexible structure 321 may be located at a distance 331D from the chip centerline 303, whereas the uppermost end 332 of the flexible structure 322 may be located at distance 332D from the chip centerline 303 that is greater than the distance 331D. Stated another way, the uppermost end 332 is located closer to the edge 300E of the semiconductor chip 300 that the uppermost end 331. Accordingly, the length 322L of the flexible structure 322 may be greater than the length 321L of the flexible structure 321. Furthermore, the length 323L of the flexible structure 323—which may have an uppermost end 333 that is located at a distance 333D from the chip centerline 303 that is greater than either of the distances 331D and 332D—may also be greater than the lengths 321L and 322L. Similarly, the flexible structure 324—which may have an uppermost end 334 that is located closer to the edge 300E (i.e., at a distance 334D from the centerline 303 that is greater than any of the distances 331D-333D) than the uppermost ends 331-333—may have a length 324L that is greater than any of the lengths 321L-323L.

FIG. 3b schematically illustrates some detailed aspects of the arrangement of the flexible structure 321 illustrated in FIG. 3a, which will now be described in further detail. It should be appreciated, however, that in certain illustrative embodiments disclosed herein, some or even all of the characteristics of the flexible structure 321 described below may similarly apply to the flexible structures 322-324 illustrated in FIG. 3a.

As shown in FIG. 3b, the flexible structure 321 may include a first contact via 321A in the metallization layer 312B immediately below the bond pad 305. In those embodiments wherein the flexible structure 321 makes up part of the circuit layout of the semiconductor chip 300, the upper end of the first contact via 321A may also be in electrical contact with the bond pad 305. The flexible structure 321 may also include a first conductive line 321B in the metallization layer 312C below the first contact via 321A, and may be arranged such that one end of the first conductive line 321B is in electrical contact with the lower end of the first contact via 321A. The first conductive line 321B may also have a length 341L, as measured away from the centerline 303 and toward the edge 300E of the semiconductor chip 300. Additionally, the first conductive line 321B of the flexible structure 321 may include a second contact via 321C in the metallization layer 312C, such that the upper end of the second contact via 321C is in electrical contact with a second end of the first conductive line 321B.

In some illustrative embodiments, the flexible structure 321 shown in FIG. 3b may also include, for example, a second conductive line 321D formed in the metallization layer 312D, where one end of the second conductive line 321D is in electrical contact with the lower end of the second contact via 321C. Similar to the first conductive line 321B, the second conductive line 321D may have length 351L. Additionally, the flexible structure 321 may also include a third contact via 321E in the metallization layer 312D which has an upper end that is in electrical contact with a second end of the second conductive line 321D. Furthermore, it should be appreciated that the flexible structure 321 may also include additional contact vias and conductive lines in the metallization layers (not shown) below layer 312D, and which may be interconnected in a manner similar to that described for elements 321A-321E above.

Depending on the overall design, the flexible structure 321 may be arranged in the metallization system 312 such that the upper end 331 of the flexible structure is 321 is positioned at a distance 331L from the chip centerline 303 and the lower end 361 of the flexible structure 321 is positioned at a distance 361D from the centerline 303. In certain illustrative embodiments, the distance 361D may be greater than the distance 331L, such that the lower end 361 of the flexible structure 321 is farther from the chip centerline 303 than its upper end 331—i.e., where the lower end 361 is closer to the edge 303E of the semiconductor chip than the upper end 331. Furthermore, in some illustrative embodiments, the length 351L of the second conductive line 321D may be greater than the length 341L of the first conductive line 321B, as measured relative to the chip centerline 303. Additionally, in those embodiments where additional contact vias and conductive lines are formed in metallization layers below layer 312D (not shown), the lengths of a given conductive lines may also be successively greater than previous adjacent conductive lines. In other embodiments, the pitch 351P relative to the chip centerline 303 between the second and third contact vias 321C, 321E may be greater than the pitch 341P between the first and second contact vias 321A, 321C. Similarly, the pitch between adjacent pairs of contact vias formed in metallization layers below layer 312D (not shown) may also be greater than the pitch between previous adjacent pairs of contact vias.

FIG. 3c schematically depicts a plan view of the flexible structure 321 and bond pad 305 illustrated in FIG. 3b. In the embodiment depicted in FIG. 3c, the flexible structure 321 is shown with additional contact via and conductive line elements, specifically, fourth and fifth contact vias 321G and 321J, and third and fourth conductive lines 321F and 321H. In certain illustrative embodiments, the flexible structure 321 may generally be positioned so that the upper end 331 of the flexible structure 321 is located either immediately below, or proximate to, the bond pad 305, and at a distance 331L from the chip centerline 303. Additionally, the flexible structure 321 may be oriented so that the lower end 361 is located at a distance 361D from the chip centerline 303 that is greater than the distance 331L, i.e., closer to the edge 300E of the semiconductor chip 300. In some illustrative embodiments, the upper end 331 of the flexible structure 321, as well as the upper ends of the flexible structures 322-324 (not shown; see FIG. 3a) may be positioned under and proximate to a side 305S of the bond pad 305 that is the farthest from the center 303C of the semiconductor chip 300 and closest to the edge 300E of the chip 300, where the tensile, or uplift, loads caused by the CTE mismatch described above may be the highest. In this way, the detrimental effects that are induced by out-of-plane loads in the metallization system 312 of the semiconductor chip 300 during the reflow process may be mitigated to at least some degree, thereby providing additional protection against occurrences of white bump defects, such as the crack 108 illustrated in FIG. 1c and described above. Furthermore, the flexible structures 321-324 may preferentially be positioned below and/or adjacent to bond pads 305 that may be located in the corner regions of the semiconductor chip 300—i.e., where the thermally induced out-of-plane loads may be the highest—such as the corner regions 200A-D of the semiconductor chip 200 illustrated in FIG. 2a and described above.

As a result, the subject matter disclosed herein provides designs for various strain-compensating fill patterns that may be used below and/or in the vicinity of bond pads that are located in those areas of a semiconductor chip where the coefficient of thermal expansion differentials may be the greatest. Accordingly, the strain-compensating fill patterns of the present disclosure may serve to eliminate, or at least mitigate, the effects of semiconductor chip and carrier substrate interactions during the chip packaging process, thereby reducing the likelihood of white bump occurrences.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor chip, comprising:
a bond pad;
a metallization layer below said bond pad, wherein said metallization layer comprises a bond pad area below said bond pad and a field area surrounding said bond pad area; and
a plurality of conductive device features in said metallization layer, said plurality of conductive device features comprising a first group of conductive device features in said bond pad area and a second group of conductive device features in said field area, wherein said first group has a first feature distribution density and said second group has a second feature distribution density that is less than said first feature distribution density, at least a portion of said plurality of conductive device features are dummy device features that do not transmit electrical current during electrical operation of said semiconductor chip, and at least one of said dummy device features is a metal plug that is not electrically connected to any other dummy device features of said semiconductor chip.

2. The semiconductor chip of claim 1, wherein said plurality of conductive device features is adapted to control dishing of an upper surface of said metallization layer during a planarizing process.

3. The semiconductor chip of claim 1, wherein at least one of said plurality of conductive device features contacts said bond pad.

4. The semiconductor chip of claim 1, wherein said semiconductor chip has a length and a width, and wherein said bond pad is located within a distance from a corner of said semiconductor chip along said length that is approximately 10% of said length and within a distance from said corner along said width that is approximately 10% of said width.

5. The semiconductor chip of claim 1, wherein said bond pad is in a last metallization layer of a metallization system that comprises at least one metallization layer comprising a low-k dielectric material having a dielectric constant of approximately 3.0 or lower.

6. A semiconductor chip, comprising:
a bond pad in a last metallization layer of said semiconductor chip; and
a flexible structure comprising an upper end and a lower end, wherein said upper end is in a metallization layer below said bond pad, said lower end is in a metallization layer below said upper end, and said upper end is closer to a centerline of said semiconductor chip than said lower end, said centerline passing through an approximate geometric center of said semiconductor chip.

7. The semiconductor chip of claim 6, wherein said flexible structure comprises a series of interconnected contact vias and conductive lines.

8. The semiconductor chip of claim 7, wherein a pitch between adjacent contact vias of said series increases between said upper end and said lower end.

9. The semiconductor chip of claim 7, wherein at least one of said contact vias and conductive lines is in a metallization layer comprising a low-k dielectric material having a dielectric constant of approximately 3.0 or lower.

10. The semiconductor chip of claim 6, wherein said upper end contacts said bond pad.

11. The semiconductor chip of claim 10, wherein said flexible structure comprises a metal.

12. The semiconductor chip of claim 6, wherein said semiconductor chip has a length and a width, and wherein said bond pad is located within a distance from a corner of said semiconductor chip along said length that is approximately 10% of said length and within a distance from said corner along said width that is approximately 10% of said width.

13. A semiconductor chip, comprising:
a metallization system comprising a plurality of metallization layers, at least one of said plurality of metallization layers comprising one of a low-k dielectric material and an ultra-low-k dielectric material;
a bond pad in a last metallization layer of said metallization system;
a first flexible structure positioned in said metallization system, said first flexible structure comprising a first upper end and a first lower end, wherein said first upper end is below said bond pad, said first lower end is in a metallization layer of said metallization system below said first upper end, and said first upper end is closer to a centerline of said semiconductor chip than said first lower end, said centerline passing through an approximate geometric center of said semiconductor chip; and a second flexible structure positioned in said metallization system, said second flexible structure comprising a second upper end and a second lower end, wherein said second upper end is below said bond pad, said second lower end is in a metallization layer of said metallization system below said second upper end, said second upper end is closer to said centerline than said second lower end, and said first upper is closer to said centerline than said second upper end, at least one of said first and second flexible structures contacting said at least one of said plurality of metallization layers comprising at least one of a low-k dielectric material and an ultra-low-k dielectric material.

14. The semiconductor chip of claim 13, wherein said first flexible structure comprises a first series of interconnected contact vias and conductive lines and said second flexible structure comprises a second series of interconnected contact vias and conductive lines.

15. The semiconductor chip of claim 14, wherein a pitch between adjacent contact vias of at least one of said first and second series increases between a respective upper end and respective lower end of said first and second flexible structures.

16. The semiconductor chip of claim 13, wherein said first lower end is a first distance from said first upper end relative to said centerline, said second lower end is a second distance from said second upper end relative to said centerline, and said second distance is greater than said first distance.

17. The semiconductor chip of claim 13, wherein said first flexible structure has a first elastic spring rate and said second flexible structure has a second elastic spring rate that is different than said first elastic spring rate.

18. The semiconductor chip claim 17, further comprising a third flexible structure positioned in said metallization system, wherein said third flexible structure comprises a third upper end and a third lower end, said third upper end is below said last metallization layer, said third lower end is in a metallization layer of said metallization system below said third upper end, said third upper end is closer to said centerline than said third lower end, said first upper end is closer to said centerline than said third upper end, and said third flexible structure has a third elastic spring rate that is different than said first elastic spring rate.

19. The semiconductor chip of claim 18, wherein at least one of said first, second and third flexible structures contacts said bond pad.

20. The semiconductor chip of claim 19, wherein said at least one of said first, second and third flexible structures comprises a metal.

21. The semiconductor chip of claim 13, wherein said semiconductor chip has a length and a width, and wherein said bond pad is located within a distance from a corner of said semiconductor chip along said length that is approximately 10% of said length and within a distance from said corner along said width that is approximately 10% of said width.

22. The semiconductor chip of claim 13, wherein at least one of said first and second flexible structures is a dummy structure that does not transmit electrical current during electrical operation of said semiconductor chip.

23. The semiconductor chip of claim 1, wherein a plurality of said dummy device features are metal plugs, and wherein a plurality of said metal plugs are not electrically connected to any other dummy device features of said semiconductor chip.

24. The semiconductor chip of claim 1, wherein a plurality of said dummy device features comprise said second group of conductive device features.

25. The semiconductor chip of claim 6, wherein said flexible structure is a dummy structure that does not transmit electrical current during electrical operation of said semiconductor chip.

* * * * *